United States Patent [19]

Nagata et al.

[11] Patent Number: 5,258,095
[45] Date of Patent: Nov. 2, 1993

[54] METHOD FOR PRODUCING A DEVICE HAVING AN INSULATOR SANDWICHED BETWEEN TWO SEMICONDUCTOR LAYERS

[75] Inventors: Shunichi Nagata; Tatsuya Mise, both of Kawasaki, Japan

[73] Assignee: Fujitsu Limited, Kanagawa, Japan

[21] Appl. No.: 837,707

[22] Filed: Feb. 20, 1992

Related U.S. Application Data

[63] Continuation of Ser. No. 463,649, Jan. 11, 1990, abandoned.

[30] Foreign Application Priority Data

Jan. 20, 1989 [JP] Japan .................................. 1-012406

[51] Int. Cl.⁵ .............................................. H01L 21/00
[52] U.S. Cl. ..................... 156/643; 156/656; 156/657; 156/646; 437/195; 437/191; 437/228
[58] Field of Search ............... 156/656, 657, 643, 646; 437/228, 191, 195

[56] References Cited

U.S. PATENT DOCUMENTS 4,808,259  2/1989  Jille, Jr. et al. .................. 156/657 X

FOREIGN PATENT DOCUMENTS

0025311  3/1981  European Pat. Off. .
0040701  12/1981  European Pat. Off. .

*Primary Examiner*—Thi Dang
*Attorney, Agent, or Firm*—Nikaido, Marmelstein, Murray & Oram

[57] ABSTRACT

With the method for producing EPROMs based on selfalignment using a gate electrode as the mask for impurity ion doping, when selectively removing an oxide film between the control gate electrode and the floating gate electrode, the side surface of control gate electrode can be formed flat without projected and recessed areas by removing a thin film deposited at random on the side surface of the upper control gate electrode. Thus, the desired channel region width can be formed, even when impurity ions are doped, with the gate electrode used as the self-alignment mask. Controllability of EPROM production can, therefore, be remarkably improved.

11 Claims, 9 Drawing Sheets

METHOD FOR PRODUCING A DEVICE HAVING AN INSULATOR SANDWICHED BETWEEN TWO SEMICONDUCTOR LAYERS

This application is a continuation of application Ser. No. 463,649 filed Jan. 11, 1990, now abandoned.

FIELD OF THE INVENTION

The present invention relates to a method for producing a device having stacked gates, for example a nonvolatile memory such as EPROM (Electrically Programmable Read Only Memory) or EEPROM (Electrically Erasable and Programmable Read Only Memory). In particular, the present invention relates to technology for improving controllability of the width of the source and the drain during manufacture based on self-alignment. A nonvolatile memory has a floating gate electrode, such as an EPROM, in which impurity ions are implanted on the control gate electrode side of a semiconductor substrate with the control gate electrode used as the mask.

BACKGROUND OF THE INVENTION

Electrically programmable semiconductor memories (hereinafter, abbreviated as EPROMs including an electrically erasable and programmable device) recently have been widely produced. The memory is called an EPROM has a structure similar to a FET and is provided with a gate electrode between both impurity layers of the source and the drain. Unlike the ordinary FET, the gate electrode has a multi-layer structure. An insulation film is interposed between the semiconductor layers, called the floating gate electrodes, and moreover a semiconductor layer called a control gate is layered.

A recent process producing EPROM's has almost been carried out based on self-alignment. In this self-alignment based process, a gate electrode is formed with polysilicon, etc., on the surface of an element forming region of the semiconductor substrate. The gate electrode itself is used as the mask when impurity ions are implanted in the substrate and the source, and drain regions are formed in both sides of the gate electrode. In recent micro-miniaturized EPROMs, the self-alignment method using the gate electrode itself as the mask is particularly effective because the positioning margin to form the mask used for ion implantation is no longer necessary, when compared with conventional methods in which the ion implantation has been conducted without using the self-alignment method.

However, with the present self-alignment process, it is important to always form the source and drain in the regulated width in order to ensure good controllability of the channel region width between the source and drain regions to minimize variation of characteristics of each EPROM completed in each process. In the self-alignment source and drain region forming method, after a gate electrode is formed on the surface of the semiconductor substrate through an oxide film, the gate electrode itself is used as the mask for impurity ion implantation. Improvement of controllability of the source and drain width depends on whether or not the side surface of gate electrode, which is used as a mask, is always formed with the same shape. For example, if any substance adheres to the side surface of the gate electrode or adheres to any partial side during the process, etching is unexpectedly generated, so that when the gate electrode is later used as the mask, the source and drain cannot always be formed in the desired position on the surface of semiconductor substrate. When deposition or partial etching at the side surface is always uniform, it may be allowed to occur, but the side surface of the gate electrode is actually always non-uniform.

Since recent EPROMs are more and more micro-miniaturized, the controllability, namely how to always uniformly produce EPROMs with the same characteristics, is a very important problem since it influences the yield. In the self-alignment process, since ion implantation to form the source and drain regions is carried out with the previously formed gate electrode itself used as the mask, the source and drain must always be formed with the same shape on the side surface of the gate electrode, which is used as the mask, in order to improve controllability in formation of the source and drain regions.

The process of producing conventional EPROMs will first be explained with reference to FIG. 2a through FIG. 2c.

Figure 2A:
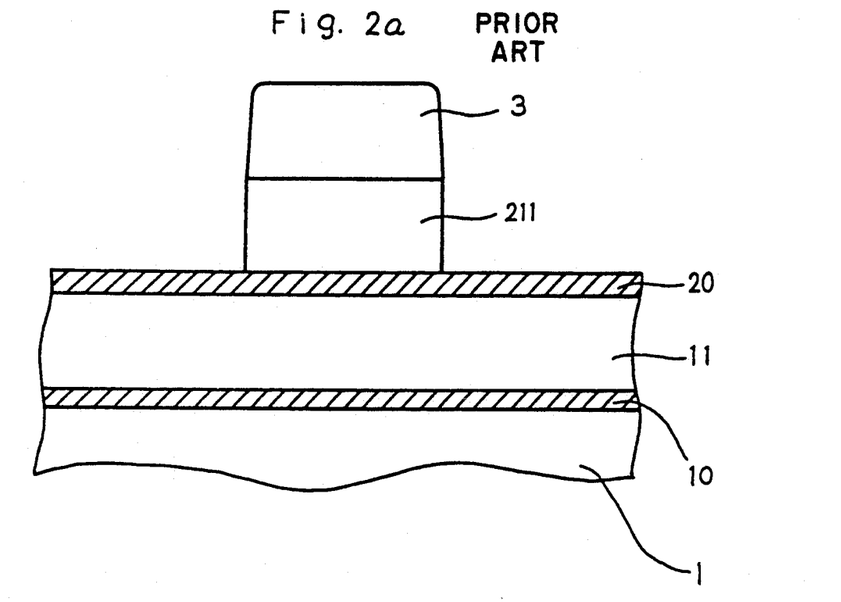
FIGS. 2(a)-2(c) show sectional views for explaining the conventional process of producing EPROMs.
Figure 2B:
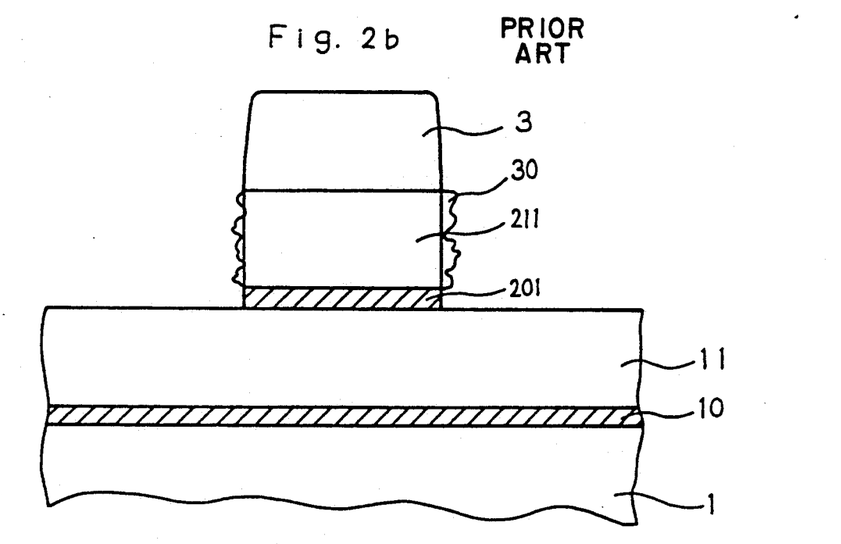
Figure 2C:
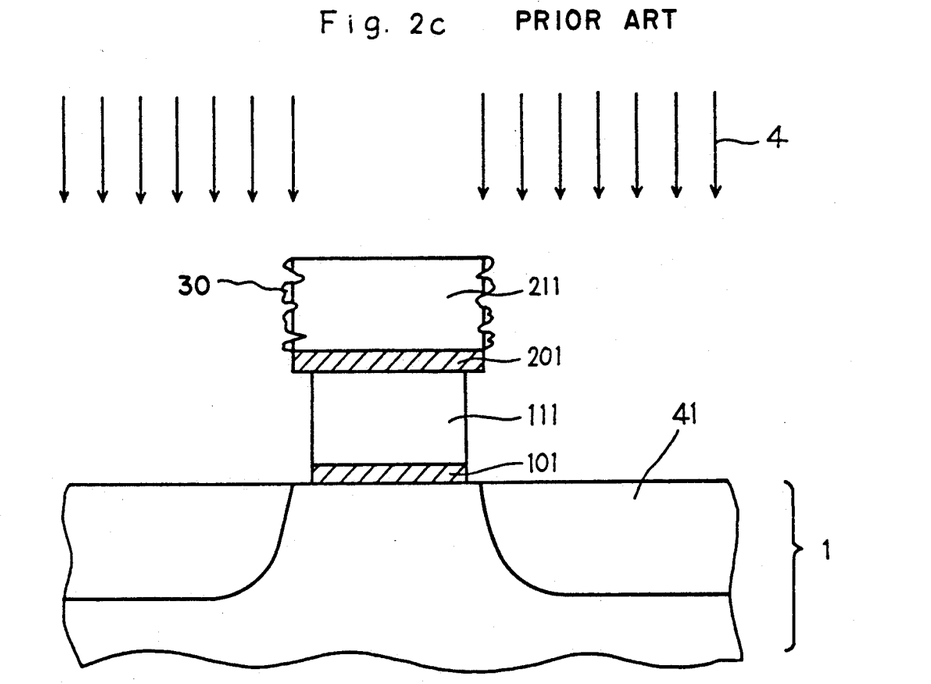

FIGS. 2 are diagrams for explaining the processes indicating conventional EPROM producing technology. In these figures, the numeral 1 designates a semiconductor substrate of a single crystal silicon. A first oxide film 10 is formed on the surface of the semiconductor substrate 1 and a first polycrystal silicon layer 11 is formed by a vapor growth method on the surface of the first oxide film 10. A second oxide film 20 is formed by thermal oxidation on the surface of the first polycrystal silicon layer 11 and a second polycrystal silicon layer (not shown) is formed by the vapor growth method on the surface the second oxide film 20. A photoresist 3 as the mask for the pattern to form the gate is partially formed on the surface of the second polycrystal silicon layer.

Figure 3A:
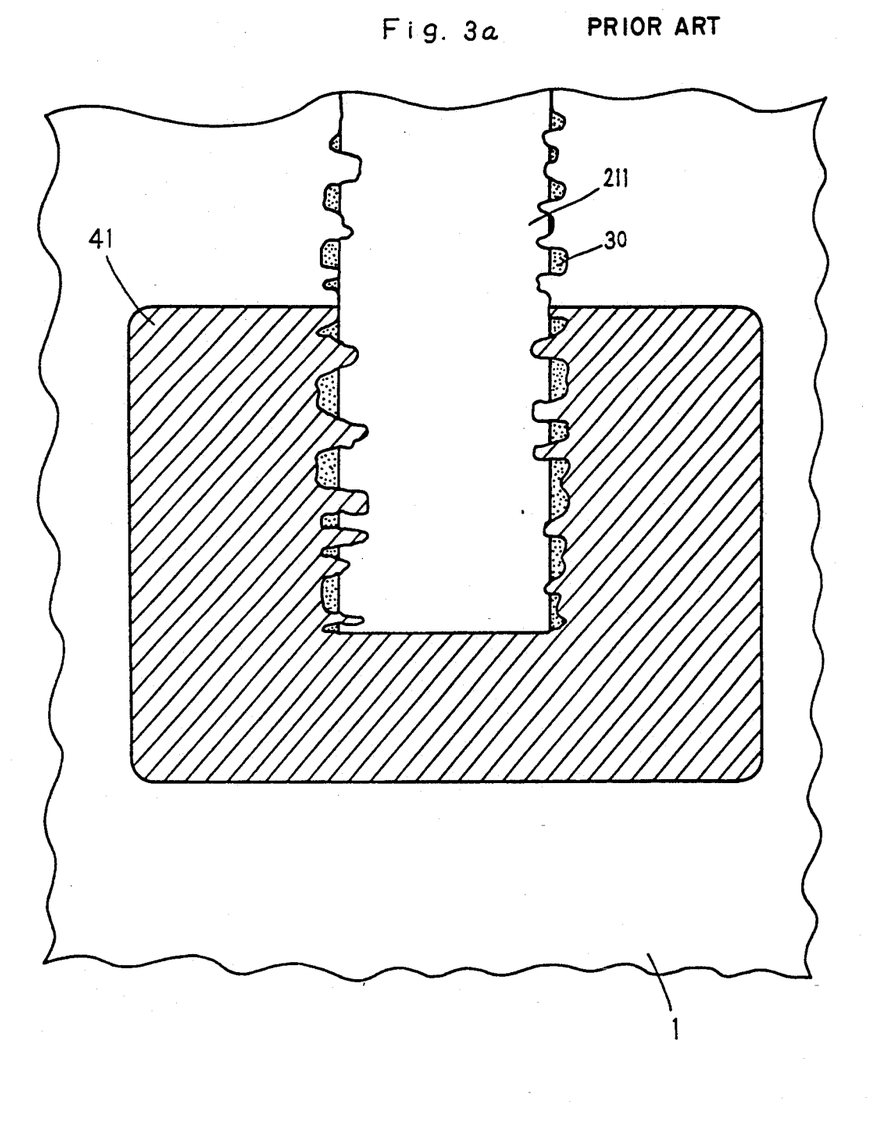
FIG. 3(a)-3(b) show top views of EPROM gate electrodes produced by the present invention and the prior art for comparison.
Figure 3B:
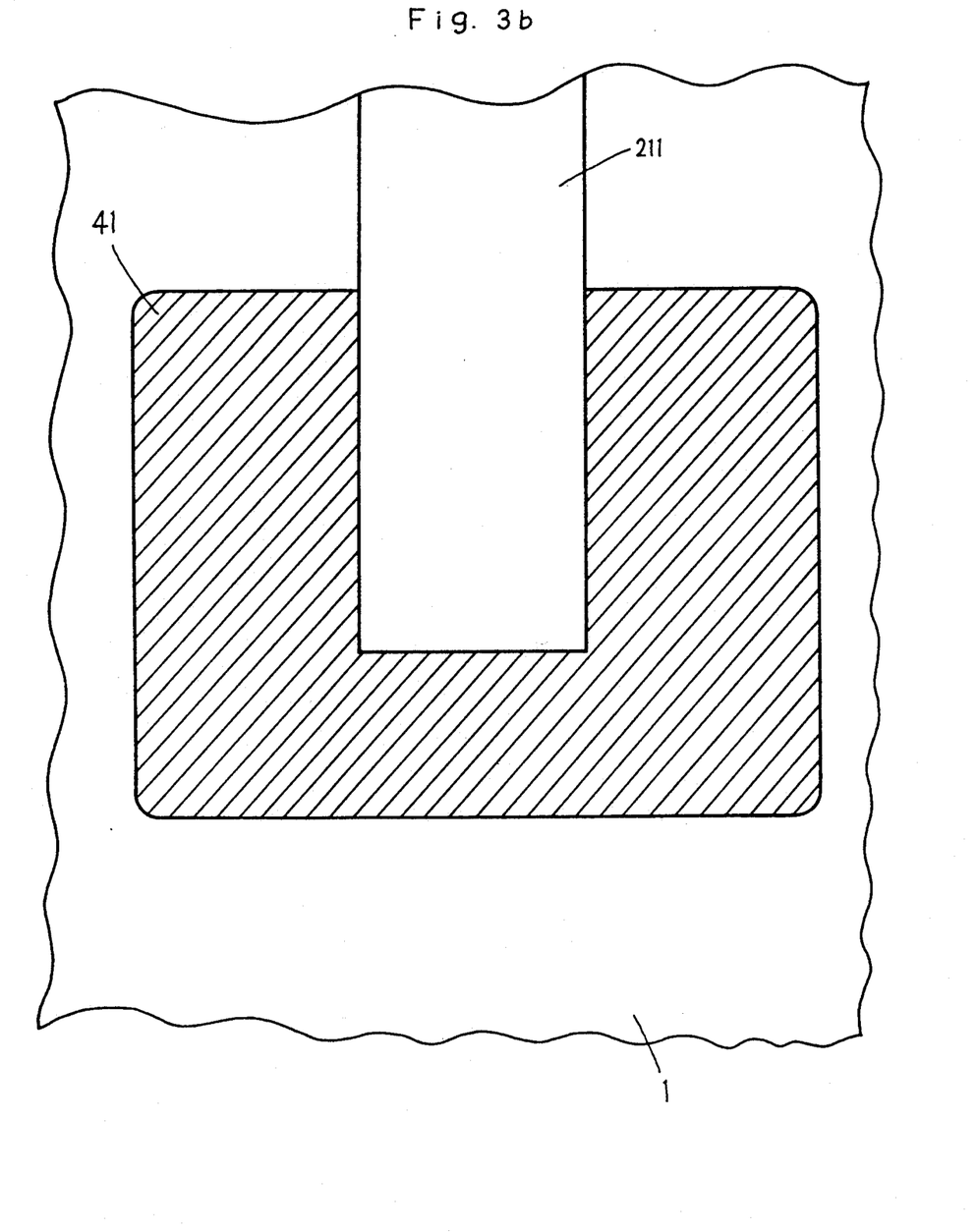

Referring to FIGS. 3a-3b for comparison, FIG. 3a is a plan view of the EPROM gate electrode produced by the prior art, while FIG. 3b is a plan view of the EPROM gate electrode produced by the present invention.

The process is sequentially explained hereunder.

In FIG. 2a, after the second polycrystal silicon layer is layered on the surface of the substrate as described previously, it is selectively removed to form the control gate electrode 211 by RIE (reactive ion etching using, for example, sulfur hexafluoride ($SF_6$) gas or tetracarbon chloride ($CCl_4$) gas) and the mask material 3 formed as described above in order to expose the second oxide film 20.

In FIG. 2b, using the same mask material as that used in the preceding process, the second oxide film 20 is selectively removed to form the gate electrode 201, for example, by RIE using methane trifluoride ($CHF_3$) gas in order to expose the first polycrystal silicon layer 11. Thereafter, the unwanted first polycrystal silicon 11 is removed by etching with RIE using $SF_6$ (sulfur hexafluoride) gas to form layer 111 and the unwanted first oxide film 10 is removed by wet chemical etching with a solution containing HF (fluoric acid) to form the gate oxide film 101. The mask material 3 is removed and after the end of this etching process, the up-diffused control gate electrode 211 is formed in the side surface. In this case, a thin film 30 is non-uniformly deposited to an average thickness of about 100 Å at the side surface of the second polycrystal silicon layer left after the etching. This thin film is thought to be formed by a silicon compound produced by reaction of the etching gas and an intermediate product of silicon forming an oxide film but it is not clear. This thin film 30 is very thin and deposited non-uniformly. Therefore, it is partly as thin as can be as though nothing is deposited, but it is partly thick enough. The thin film 30 is also obvious from FIG. 3a.

When etching the polycrystal silicon 11 with the RIE method using a gas containing sulfur hexafluoride ($SF_6$) having selective isotropic characteristics, the side surface of the gate 111 is etched as shown in FIG. 2c. Etching in the lateral direction of the gate electrode with the RIE method sulfur hexafluoride ($SF_6$) is about 0.1–0.3 µm when the gate electrode is 3000–4000 Å thick. Etching in the lateral direction of the gate electrode, mentioned above, is also observed when etching with the RIE method using other gaseous etchants.

As explained previously, since the thin film 30 has a non-uniform thickness, partly has holes and is deposited on the side surface of the control gate electrode, the areas having the holes are selectively etched. Accordingly, after the RIE method to form the floating gate electrode, the side surface of the control gate electrode becomes uneven.

As described above, according to the conventional method of producing EPROMs, as shown in FIG. 3a, the side surface of control gate electrode, to be used as the mask for implantation of impurity ions, becomes rough and does not always have the same shape in each production process. The source and drain regions formed with such an electrode used as the mask cannot provide EPROMs having the same characteristics in every process. In the worse case, the characteristics of the EPROMs may be so deteriorated that they cannot be put into practical use, and therefore, influence the production yield. This problem of the prior art will become more serious with further micro-miniaturization of the gate electrode itself in the future.

In other prior art, etching of oxide film sandwiched by the gate electrodes can be done by a chemical wet etching method instead of RIE. In this case, after the upper control gate electrode is removed by RIE, the entire substrate is removed from the RIE chamber and the oxide film is exposed to a thin aqueous solution of HF (fluoric acid). Thereafter, the substrate is again returned into the RIE chamber. However, according to this method, since the entire substrate must be removed from the chamber in order to etch the oxide film, the substrate surface is naturally exposed to oxygen and the oxide film is probably formed particularly in the area in which silicon is exposed. Since the etchants as well as the thin aqueous solution of HF have the property to anisotropically proceed etching, the oxide film is also etched in the internal direction of the gate during etching of the oxide film. In the case of wet chemical etching, the end point of the etching cannot be detected accurately. Therefore, if the substrate is continuously soaked in the etchant even after all the desired oxide film is removed, the oxide film between the gate electrodes which should not be removed, is also thereby removed. In addition, since the degree of removal cannot be detected, it is impossible to predict how much deviation will occur from the desired operation characteristic defined in the design state. Thus, it is also difficult, even with etching the oxide film with an aqueous solution of HF, to form EPROMs having the desired operation characteristics defined in the design stage.

SUMMARY OF THE INVENTION

The inventors of the present invention have reached the present invention by determining that when the gate length is further micro-miniaturized up to 0.5 µm or less in the future, it will be very difficult for the prior art to produce EPROMs with a lower failure rate and with good reproducibility. The problem of controlling the formation of the source and the drain results from a thin film non-uniformly deposited on the side surface of the gate electrodes. This thin film can easily be removed in the present invention, for example, by sputtering using argon gas.

It is, therefore, an object of the present invention to provide a method for producing a semiconductor device wherein the side surfaces of gate electrodes, which are used as masks, can always be formed with the same shape and with good reproducibility in order to controllably form the source and drain layers by doping of impurity ions based on self-alignment with the gate electrode, which is itself formed first on the surface of the semiconductor substrate, used as the mask.

This object can be achieved by the method for producing a semiconductor device explained hereunder.

The process for producing a device having an insulator sandwiched between two semiconductor layers, comprises the steps of, first, forming a mask (3) on a surface of a second semiconductor layer (21), which is formed on a layered structure of a semiconductor substrate (1), on which is formed a first insulating layer (10), a first semiconductor layer (11), and a second insulating layer (20) in order. Second, the second semiconductor layer (21) is selectively removed using the mask (3) until a surface of the second insulating layer (20) is exposed, and a second electrode (211) is formed. Third, the exposed second insulating layer (20) is selectively removed using the second electrode (211) as a mask, and the first semiconductor layer (11) is exposed. Fourth, a thin film (30), which is already deposited on a side surface of the second electrode (211) in the second step is removed. Fifth, the exposed first semiconductor layer (11) is selectively removed using the second electrode (211) as a mask, and the first electrode (111) is formed. Sixth, all of the mask (3) is removed. Finally, an impurity ion (4) is doped into the semiconductor substrate (1) using the second electrode (211) as a mask, and an impurity deposit region (41) is formed.

The present invention provides improved controllability of forming the source and drain layers by forming them in a predetermined shape as a method of producing EPROMs based on self-alignment. Namely, the present invention is a method of producing EPROMs, in which the gate electrode itself is used as the mask for impurity ion implantation. A reproducible micro-miniaturized gate electrode can be formed by the present invention. Impurity ion implantation to form the source and drain layers using the gate electrode as the mask can always be made the same way with good reproducibility and lower failure rate than in the prior art.

In the production process of the present invention, proceeding with the RIE process (for the control gate electrode, the oxide film and then the floating gate electrode), during removal of the oxide film by etching, if a thin film, which is formed by the intermediate product consisting of the oxide film and the etching gas, is deposited non-uniformly on the side surface of control gate electrode, this thin film is removed immediately after formation, for example, by sputtering with an argon (Ar) gas. Therefore, the side surface of control gate electrode is uniformly etched during the removal of the material of the floating gate electrode. Both side surfaces of the control gate electrode and the floating gate electrode are formed as a flat surface and do not include projected and recessed areas. Thereby, successive implantation of impurity ions into the substrate can be made with good controllability.

The object, structure and effect of the present invention will be explained in detail with reference to the accompanying drawings.

DETAILED DESCRIPTION OF THE INVENTION

The present invention is based on the novel finding that the controllability of forming EPROMs can be improved by removing a thin film, which is deposited on a side surface of a gate electrode which is used as the mask for impurity ion implantation. The thin film makes the side surface of the gate electrode uneven.

The present invention will be explained in further detail by taking an embodiment thereof into consideration, but the present invention is not limited at all to this embodiment. For example, the present invention can also be applied to a semiconductor device such as an EEPROM (Electrically Erasable and Programmable Read Only Memory) having a structure in which the gate oxide film, between the silicon substrate and floating gate electrode, is formed to partly include a thinner area such as a tunnel oxide film which enables electrical erasure. Moreover, the present invention can also be applied to a silicon electrode and a wiring layer sandwiching the oxide film.

EXAMPLE 1

The producing process of producing an n-channel EPROM is explained as an embodiment of the present invention. FIGS. 1(a)-1(j) show sectional views for explaining the process as an embodiment of the present invention. In FIGS. 1(a)-1(j), the elements have the same numbers as those of FIGS. 2(a)-2(c) and indicate the same elements. In the following explanation, reference is also made to FIGS. 3(a)-3(b).

The process indicated by FIG. 1(a)-1(e) are almost the same as those of the conventional EPROM.

Figure 1A:
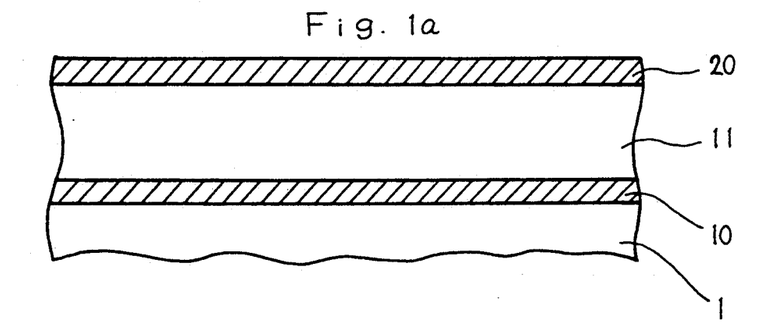
FIGS. 1(a)-1(j) show sectional views for explaining the process of producing EPROMs as an embodiment of the present invention.
Figure 1B:
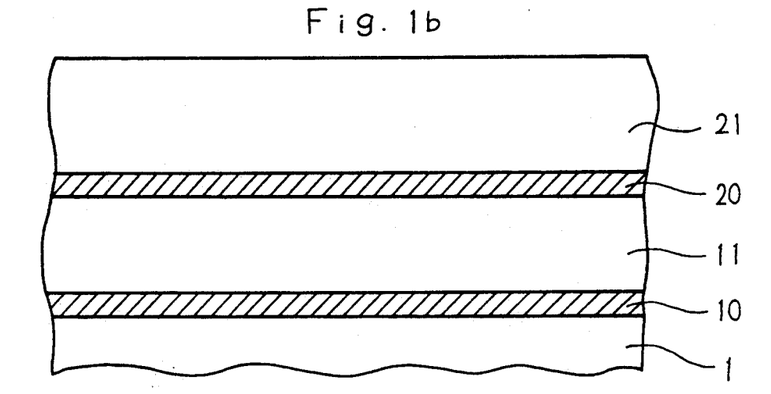

In FIG. 1(a), a first oxide film 10, a first polycrystal silicon layer 11, a second oxide film 20, and a second polycrystal silicon layer 21 (shown in FIG. 1(b)) are stacked on the surface of a semiconductor substrate 1 formed of a p-type silicon. For the formation of the polycrystal silicon layer, vapor growth of a monosilane (SiH$_4$) is used, while for the formation of the oxide film, a surface heating process is employed. Both first oxide film 10 and second oxide film 20 will later become the gate oxide film and the first polycrystal silicon layer 11, sandwiched between these oxide films, will later become the floating gate electrode. The thickness of the first oxide film 100 is 400 Å and that of the first polycrystal silicon layer 11 is 4000 Å.

FIG. 1(b) shows a process of forming the second polycrystal silicon layer 21 on the entire surface of the second oxide film 20. The second polycrystal silicon layer 21 will later become the control gate electrode and can be formed by the vapor growth method.

Figure 1C:
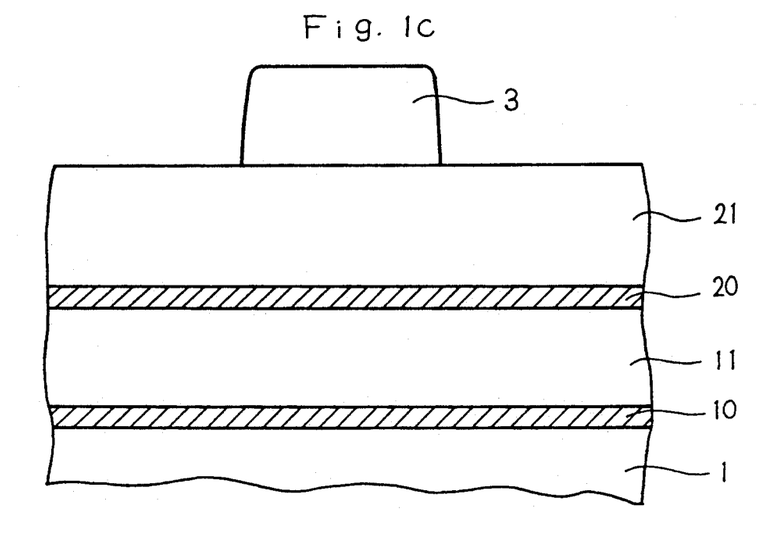

FIG. 1(c) shows a process of printing the mask material 3 partly on the surface of the second polycrystal silicon layer 21. The mask material 3 is used as the mask during etching to form the control gate electrode. This mask is formed by a photoresist having a thickness of about 1.3 μm.

Figure 1D:
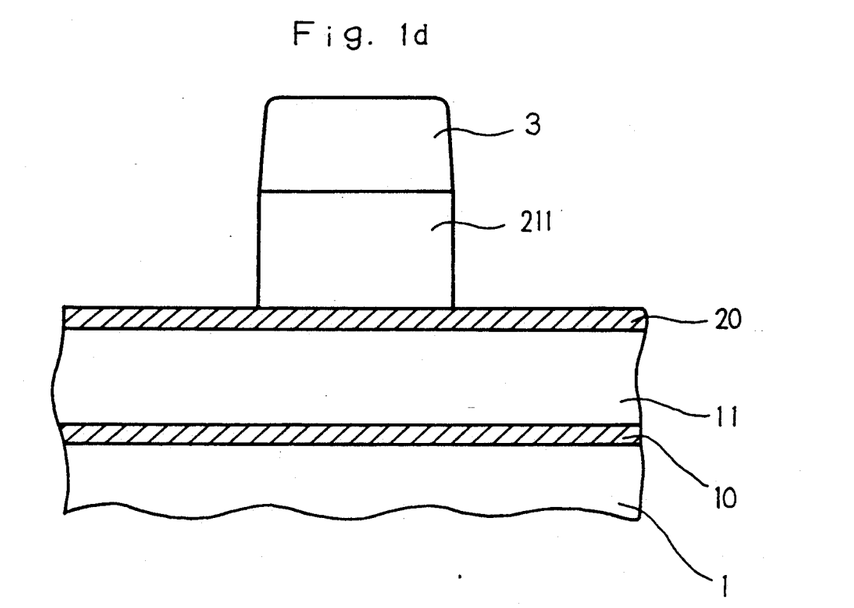

FIG. 1(d) shows a process of selectively removing the second polycrystal silicon layer 21 using the mask material 3 formed as described above. Usually, etching is carried out until the second oxide film 20 is exposed. Etching is carried out using a mixed gas of CCl$_4$ of 175 sccm (standard cubic centimeter per minute) and O$_2$ of 5-10 sccm as the etchant in the RIE process. The duration is about a minute. The remaining part of the second polycrystal silicon layer 21 will become the control gate electrode 211.

Figure 1E:
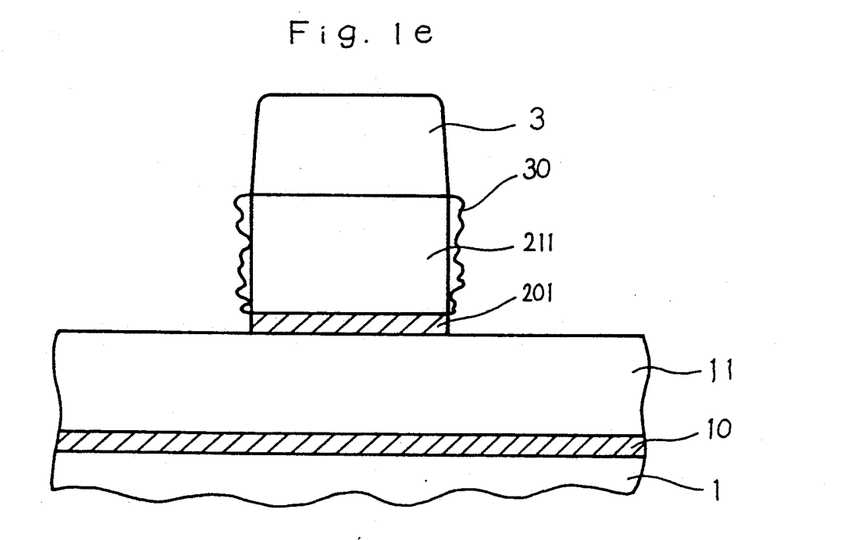

FIG. 1(e) shows a process of exposing the first polycrystal silicon layer 11 by selectively removing the second oxide film 20. The mask material 3 is also formed for removal of the second oxide film 20. In the removal process of the second oxide film 20, etching is carried out for 90 seconds in a parallel plate type of etcher which ensures batch processing using CHF$_3$ (methane trifluoride) as the etchant under the condition that the flow rate of the methane trifluoride is 30 sccm, RF power is 1100 W and the processing chamber pressure is 0.1 Torr. In this case, the remaining second oxide film 20 will become the gate oxide film 201. During this etching process, a thin film 30 is deposited on the side surface of the control gate electrode 211.

Figure 1F:
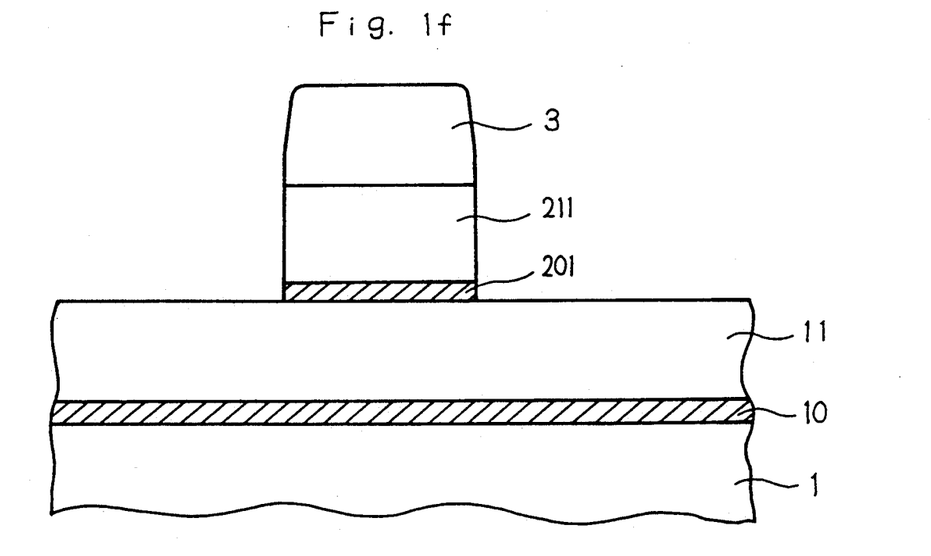

FIG. 1(f) shows a process for removing the thin film 30 deposited on the side surface of the control gate electrode 211. Sputter etching using a barrel type of etcher is conducted for seven minutes under the condition that the flow rate of argon gas is several tens of sccm, RF power is 300 W and chamber pressure is 0.5 Torr in order to remove the thin film 30 (thickness is about 100 Å). As a result, the under layer of control gate electrode 211 is exposed.

Figure 1G:
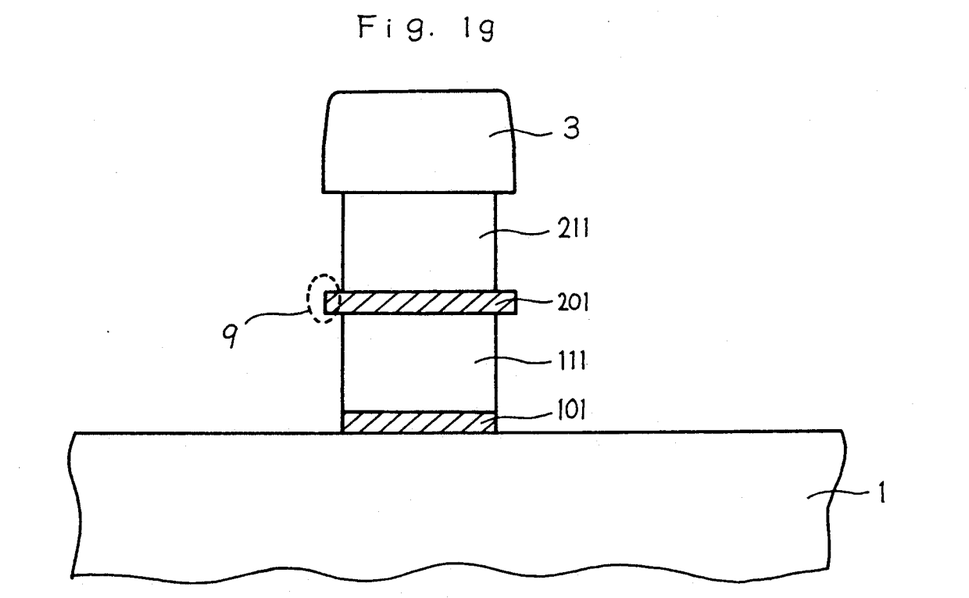

FIG. 1(g) shows a process for selectively removing the first polycrystal silicon layer 11, forming the floating gate electrode 111 and then removing the first oxide film 10 other than that under the floating gate electrode 111 to expose the surface of the semiconductor substrate 1. For etching of the first polycrystal silicon layer 11, a mixed gas of SF$_6$ of 44 sccm and C$_2$ClF$_5$ of 77 sccm is used. Since removal of the oxide film does not proceed toward the side surface of the gate electrode, a projected area 9 is formed by the oxide film remaining on the side surface. The projected area 9 formed by the oxide film remaining on the side surface has a height of about 0.2 μm. Etching toward the side surface of the gate electrode width of 1.2 μm has been conducted to a degree of about 0.2 μm. Therefore, if the side surface includes the projected and recessed areas, the height of these areas is 100 Å or less, because the SEM beam used for observation of the surface is about 100 Å. When the gate electrode is formed by the prior art, the side surface of gate electrode includes unevenness of about 0.2 μm, but observation by the SEM beam has shown that unevenness in the present invention is about 0.01 μm or less. So far, observation by at least the SEM beam shows that the side surface of gate electrode has been formed flat. The first oxide film 10 is etched by wet chemical etching using fluoric acid as the etchant. In this case, etching is carried out for 90 seconds with the etchant obtained by mixing ammonium fluoride of 1680 cc and fluoric acid of 195 cc into pure water of 1170 cc. The first oxide film 10 under the remaining floating gate electrode 111 will become the gate oxide film 101.

With the processes described above, the multi-layer structure stacking, starting from the bottom, the semiconductor substrate 1, gate oxide film 101, floating gate electrode 111, gate oxide film 201, control gate electrode 211 and mask material 3 can be formed. With the above processing, the thin film deposited at the side surface of the control gate electrode can be removed. The control gate electrode does not allow formation of an up-doped area and thereby, the side surface of the gate becomes flat without including the projected and recessed areas.

Figure 1H:
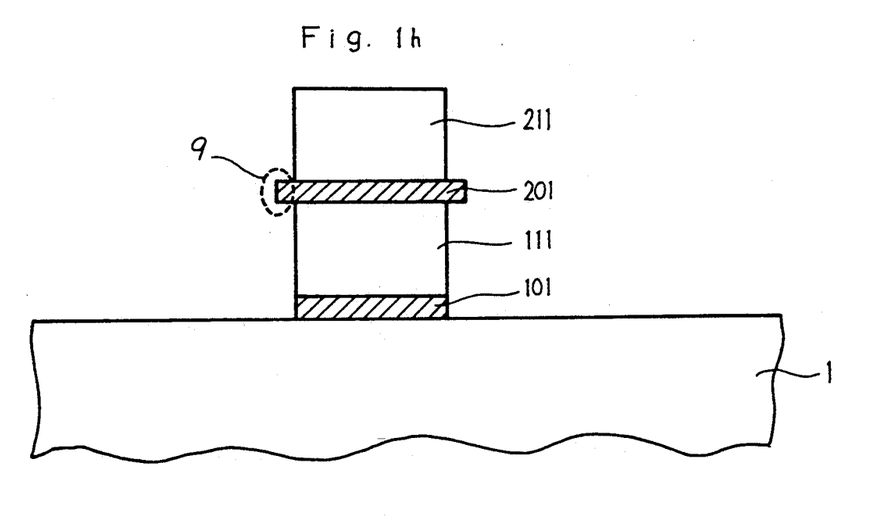

FIG. 1(h) shows a process for removing the mask material 3. In view of removing the mask material 3, processing is conducted for 30 minutes using the batch type processing unit under the condition that the degree of vacuum is 1.0 Torr, flow rate of oxygen ($O_2$) is several tens of sccm, and RF power is 500 W. Here, the $O_2$ plasma etching and POS processing (wet chemical etching using Peroxosulferic acid: heated up to 120° C.) are carried out. For this purpose, the hydrogen peroxide 1 (volume ratio) is mixed to the sulferic acid $H_2SO_4$ 50. This mixed solution is heated up to 120° C. to form peroxosulferic acid $H_2SO_5$ for processing.

Figure 1I:
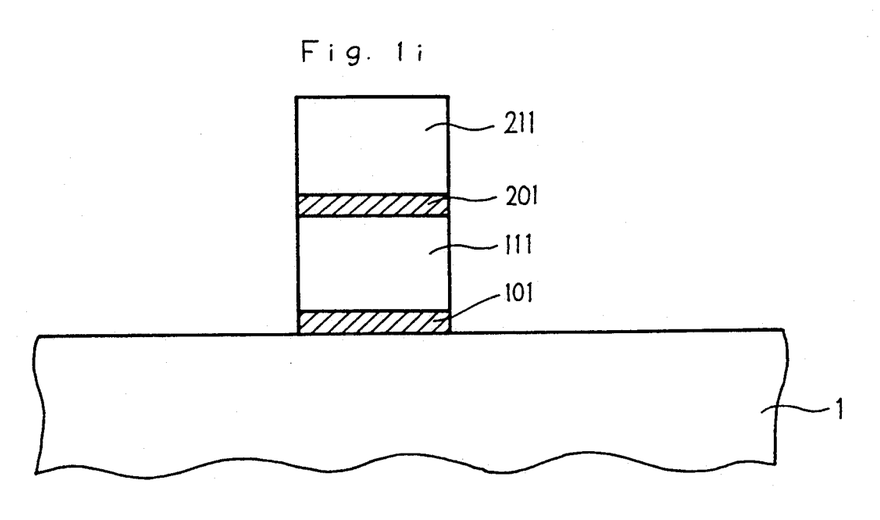

FIG. 1(i) shows a process for removing the projected areas 9 formed by the unetched first oxide film 10 remaining after the preceding process and the oxide film remaining on the side surface of the second oxide film 20. For the etching process, wet chemical etching has been conducted for 110 seconds using a mixed solution of water 100 and HF 10 (volume ratio) as the etchant.

Figure 1J:
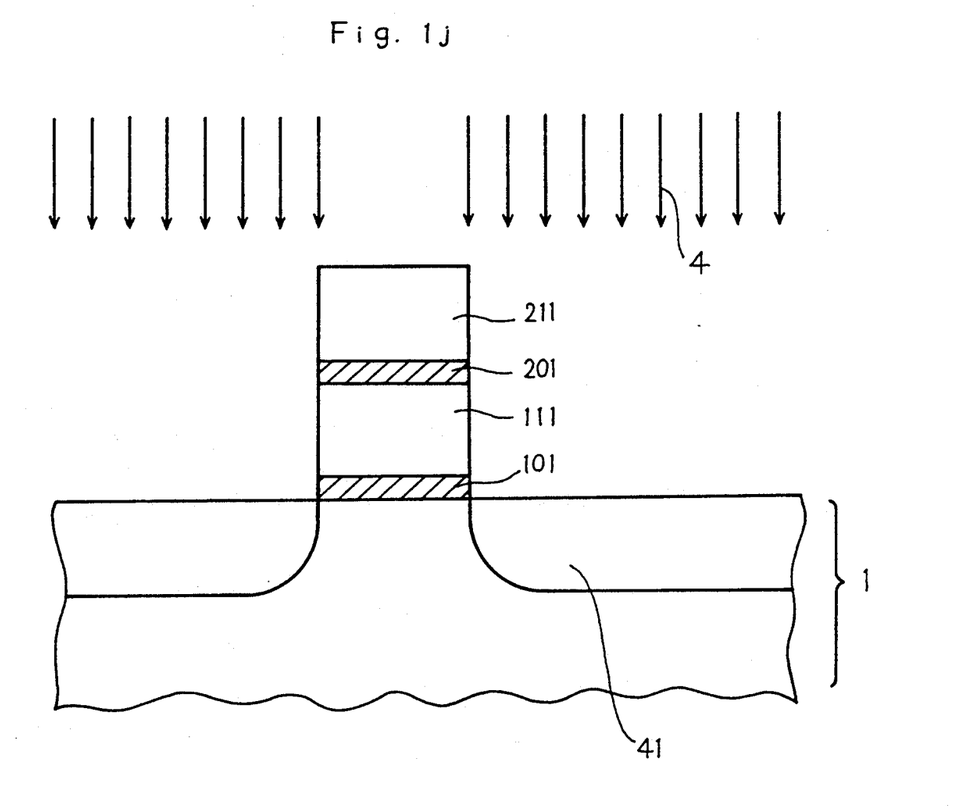

FIG. 1(j) shows a process for forming an insulator layer by doping n-type impurity ions 4 such as As (arsenic) into the surface of a semiconductor substrate 1 with a dose of $4 \times 10^{15}$ cm$^{-2}$ under the condition of 70 eV. When a very thin oxide film is formed on the ion doping surface of the semiconductor substrate 1 by adding a single process before doping impurity ions, damage to the semiconductor substrate 1 by ion doping can be reduced.

As described above, since the reproducibility in the shape of the side surface of the gate electrode which is used as the mask in impurity ion implantation can be enhanced in the process based on self-alignment in which the control gate electrode itself is used as the mask for impurity ion doping, the producing method which ensures impurity ion doping to the substrate surface with good reproducibility in the desired characteristics can be realized. The EPROM completed by the present invention has a gate length (channel length) of about 1.2 μm, but unevenness of the side surface is suppressed to within about 0.01 μm or less (unevenness at the side surface of the gate is under the measuring limit by of a SEM beam). In the prior art, for example, with the method of using a $CCl_4$ gas to form the electrode having the same gate length, non-uniform projected and recessed areas as large as 0.2 μm are generated on the side surface of the gate and the reproducibility is extremely poor. The method of the present invention forms, with considerable allowance, the microminiaturized gate electrode having a length of 0.5 μm. However, in the prior art, even when HBr (hydrogen bromide) having high anisotropy is used to form the gate electrode in the same gate length of 0.5 μm, the projected and recessed areas as large as 0.05 μm are generated at the side surface of the gate electrode. Therefore, reproducibility in formation of the source and drain layers becomes poor and the failure rate deteriorates in the prior art.

The present invention permits various changes or modifications other than the content disclosed herein. Explanation of the present invention has been made with reference to an EPROM but the present invention provides similar effects even when it is applied to devices other than EPROMs, such as a substrate having a multi-layer wiring structure. In addition, a SOI (Silicon on Insulator) substrate may be used in place of sequentially stacking the first insulator film 10 and first semiconductor layer 11 on the surface of the semiconductor substrate 1. Sputtering is introduced for the process to remove a thin film 30 of the present embodiment, but may be replaced with the other removal methods.

As explained heretofore, according to the present invention, an impurity layer can be formed in the closest proximity to the gate, thereby the gate length can be shortened and high speed EPROMs can be realized.

From the foregoing description of the preferred embodiment of the invention, it will be apparent that many modifications may be made therein. It should be understood that these embodiments are intended as one example of the invention only, and that the invention is not limited thereto. Therefore, it should be understood that the appended claims are intended to cover all modifications that fall within the true spirit and scope of the invention.

What is claimed is:

1. A process for producing a device having an insulator sandwiched between two conductor layers, the process comprising the steps of:
   (a) forming a first insulating layer on a conductive substrate, a forming first conductor layer on said first insulating layer, forming a second insulating layer on said first conductor layer, forming a second conductor layer on said second insulating layer and forming a first mask selectively on said second conductor layer;
   (b) removing the second conductor layer selectively using said first mask until exposing a surface of the second insulating layer, and forming a second electrode;
   (c) removing the exposed second insulating layer selectively, using said second electrode with said first mask as a second mask, by dry etching, and exposing the first conductor layer;
   (d) removing a thin film which is already deposited on a side surface of the second electrode formed in step (c);
   (e) removing the exposed first conductor layer selectively using said second mask, and forming a first electrode;
   (f) removing said first mask; and
   (g) doping an impurity ion in the conductor substrate using the second electrode as a third mask, and forming an impurity doped region.

2. A process as set forth in claim 1, wherein at least one of said first and second conductor layers comprises a semiconductor layer.

3. A process as set forth in claim 1, wherein a way of selectively removing said first conductor layer or said second insulating layer is an anisotropic etching.

4. A process as in the steps (b), (c), (e) of claim 1, wherein a way of selectively removing said first conductor layer or said second insulating layer is Reactive Ion Etching.

5. A process as in claim 3 wherein said anisotropic etching is carried out with a gas mixture containing sulfur hexafluoride supplied to a reactor.

6. A process as claimed in claim 1 wherein a way of removing the thin film in step (d) is by using a sputter etching.

7. A process as claimed in claim 1, wherein a way of removing the thin film in step (d) is by using a gaseous plasma.

8. A process for producing a device having an insulator sandwiched between two conductor layers, the process comprising the steps of:
(a) forming a first insulating layer on a silicon on insulation substrate, forming a first conductor layer on said first insulating layer, forming a second insulating layer on said first conductor layer, forming a second conductor layer on said second insulating layer and forming a first mask selectively on said second conductor layer;
(b) removing the second conductor layer selectively using said first mask until exposing a surface of the second insulating layer, and forming a second electrode;
(c) removing the exposed second insulating layer selectively, using said second electrode with said first mask as a second mask, by dry etching, and exposing the first conductor layer;
(d) removing a thin film which is already deposited on a side surface of the second electrode formed in step (c);
(e) removing the exposed first conductor layer selectively using said second mask, and forming a first electrode;
(f) removing said first mask; and
(g) doping an impurity ion in the conductor substrate using the second electrode as a third mask, and forming an impurity doped region.

9. A process as claimed in claim 1, further comprising the step of:
between step (e) and step (g);
etching the exposed second insulating layer, which is raised on the side of the first and second electrodes, in an etching solution.

10. A process as in claim 1, wherein said mask is a photoresist.

11. A process as in claim 1, wherein said second insulating layer comprises a layer formed of silicon oxide ($SiO_2$).

* * * * *